United States Patent
Seshadri et al.

(10) Patent No.: US 10,658,521 B2
(45) Date of Patent: May 19, 2020

(54) ENABLING RESIDUE FREE GAP FILL BETWEEN NANOSHEETS

(71) Applicant: International Business Machines Corporation, Armonk, NY (US)

(72) Inventors: Indira Seshadri, Niskayuna, NY (US); Ekmini Anuja De Silva, Slingerlands, NY (US); Jing Guo, Niskayuna, NY (US); Ruqiang Bao, Niskayuna, NY (US); Muthumanickam Sankarapandian, Niskayuna, NY (US); Nelson Felix, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/980,561

(22) Filed: May 15, 2018

(65) Prior Publication Data
US 2019/0355851 A1   Nov. 21, 2019

(51) Int. Cl.
*H01L 21/02* (2006.01)
*H01L 21/336* (2006.01)
(Continued)

(52) U.S. Cl.
CPC .................. *H01L 29/78696* (2013.01); *H01L 21/823412* (2013.01); *H01L 27/088* (2013.01);
(Continued)

(58) Field of Classification Search
CPC ......... H01L 21/76835; H01L 21/76837; H01L 21/0273; H01L 21/2254; H01L 21/47; H01L 21/312; H01L 21/02118; H01L 2221/1057; H01L 2221/1063; H01L 27/088; H01L 27/092; H01L 21/0245; H01L 21/02381; H01L 21/02505; H01L 21/02507; H01L 21/0271; H01L 21/32115;
(Continued)

(56) References Cited

U.S. PATENT DOCUMENTS 5,489,553 A    2/1996  Chen
5,536,681 A    7/1996  Jang et al.
(Continued)

OTHER PUBLICATIONS

Kazuhiko Komura et al., "Spin-on organic hardmask for topo-patterned substrate" 2014.

*Primary Examiner* — Natalia A Gondarenko
(74) *Attorney, Agent, or Firm* — Fleit Intellectual Property Law; Thomas S. Grzesik

(57) ABSTRACT

A semiconductor structure and a method for fabricating the same. The semiconductor structure includes at least a first channel region and a second channel region. The first channel region and the second channel region each include metal gate structures surrounding a different nanosheet channel layer. The metal gate structures of the first and second channel regions are respectively separated from each other by an unfilled gap. The method includes forming a gap fill layer between and in contact with gate structures surrounding nanosheet channel layers in multiple channel regions. Then, after the gap fill layer has been formed for each nanosheet stack, a masking layer is formed over the gate structures and the gap fill layer in at least a first channel region. The gate structures and the gap fill layer in at least a second channel region remain exposed.

14 Claims, 15 Drawing Sheets

(51) Int. Cl.
*H01L 21/8234* (2006.01)
*H01L 21/8238* (2006.01)
*H01L 27/088* (2006.01)
*H01L 29/06* (2006.01)
*H01L 29/10* (2006.01)
*H01L 29/423* (2006.01)
*H01L 29/786* (2006.01)

(52) U.S. Cl.
CPC ...... *H01L 29/0665* (2013.01); *H01L 29/1033* (2013.01); *H01L 29/42392* (2013.01)

(58) Field of Classification Search
CPC ............... H01L 21/3212; H01L 21/311; H01L 21/31127; H01L 29/0665; H01L 29/0882; H01L 29/1029; H01L 29/1033; H01L 29/42312; H01L 29/4232; H01L 29/42392; H01L 29/78696; H01L 29/78654; H01L 21/473; H01L 21/475; H01L 21/47573; H01L 21/441; H01L 21/76819; H01L 21/76801; H01L 21/76802; H01L 21/76289; H01L 21/8232; H01L 21/823412; H01L 21/82345; H01L 21/823807; H01L 21/823857; H01L 21/823468; H01L 21/00; H01L 21/02; H01L 21/02378; H01L 21/02428; H01L 21/02444; H01L 21/02496; H01L 21/02518; H01L 21/02527; H01L 21/02529; H01L 21/02532; H01L 21/20; H01L 21/2033; H01L 21/2053; H01L 21/2251; H01L 21/2253; H01L 21/02603; H01L 21/0257; H01L 21/3065; H01L 21/3215; H01L 21/32155; H01L 21/23857; H01L 21/82385; H01L 21/823814; H01L 21/67069; H01L 21/76877; H01L 21/823821; H01L 21/823842; H01L 29/66621; H01L 29/66628; H01L 29/66575; H01L 29/78687; H01L 29/78651; H01L 29/4908; H01L 2029/42388; H01L 29/41733; H01L 29/6656; H01L 29/66545; H01L 29/0673; H01L 29/401
USPC ....... 257/401, 407, 351, 369, 357, 347, 192, 257/338, 241, 331; 438/479, 733, 753, 438/752, 135, 142, 153, 154, 157, 163, 438/267, 283
See application file for complete search history.

(56) References Cited

U.S. PATENT DOCUMENTS

| | | |
|---|---|---|
| 6,391,472 B1 | 5/2002 | Lamb, III et al. |
| 9,209,067 B2 | 12/2015 | Park et al. |
| 9,252,022 B1 | 2/2016 | Dechene et al. |
| 9,362,120 B2 | 6/2016 | Su |
| 9,660,033 B1* | 5/2017 | Chen ................... H01L 29/1054 |
| 9,671,694 B1 | 6/2017 | Glodde et al. |
| 9,741,792 B2 | 8/2017 | Cheng et al. |
| 9,859,166 B1 | 1/2018 | Cheng et al. |
| 2016/0195814 A1* | 7/2016 | Enomoto ................. G03F 7/40 430/311 |
| 2017/0351174 A1* | 12/2017 | Osaki ................. C09D 133/062 |
| 2018/0315667 A1* | 11/2018 | Kwon ............. H01L 21/823842 |

* cited by examiner

ENABLING RESIDUE FREE GAP FILL BETWEEN NANOSHEETS

BACKGROUND OF THE INVENTION

The present disclosure generally relates to metal-oxide-semiconductor field-effect transistors (MOSFET), and more particular relates to nanosheet transistors.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

As semiconductor devices scale to smaller dimensions, nanosheet (nanowire) devices provide advantages. Stacked nanowires provide area efficiency. Stacked nanowires provide, for example, increased drive current within a given layout area.

SUMMARY OF THE INVENTION

In one embodiment, a method for forming a semiconductor structure is provided. The method comprises at least forming, within each channel region of a plurality of channel regions, a gap fill layer between and in contact with gate structures surrounding nanosheet channel layers. Then, a masking layer is formed over at least the gate structures and the gap fill layer in at least a first channel region of the plurality of channel regions. The gate structures and the gap fill layer in at least a second channel region of the plurality of channel regions remain exposed. Gate structures and gap fill layer in the exposed channel region are then stripped selective to the masking layer without leaving any gap-fill material residue between the sheets. The masking material is then removed and the gap fill material in the masked channel region is stripped, resulting in intact gate structures in the masked channel and fully removed gate structures in the unmasked channel, with no residual gap full material. Subsequent re-deposition of gate structure enables residue free dual thickness/species of gate metals in the first and second channel.

In another embodiment, a semiconductor structure is provided. The semiconductor structure comprises at least a first channel region comprising and a second channel region. The first channel region comprises a first plurality of metal gate structures each surrounding a different nanosheet channel layer. The metal gate structures of the first plurality of metal gate structures are separated by an unfilled gap. The second channel region comprises a second plurality of metal gate structures each surrounding a different nanosheet channel layer. The metal gate structures of the second plurality of metal gate structures are separated by an unfilled gap.

In a further embodiment, an integrated circuit is provided. The integrated circuit comprises a semiconductor structure comprising at least a first channel region comprising and a second channel region. The first channel region comprises a first plurality of metal gate structures each surrounding a different nanosheet channel layer. The metal gate structures of the first plurality of metal gate structures are separated by an unfilled gap. The second channel region comprises a second plurality of metal gate structures each surrounding a different nanosheet channel layer. The metal gate structures of the second plurality of metal gate structures are separated by an unfilled gap.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
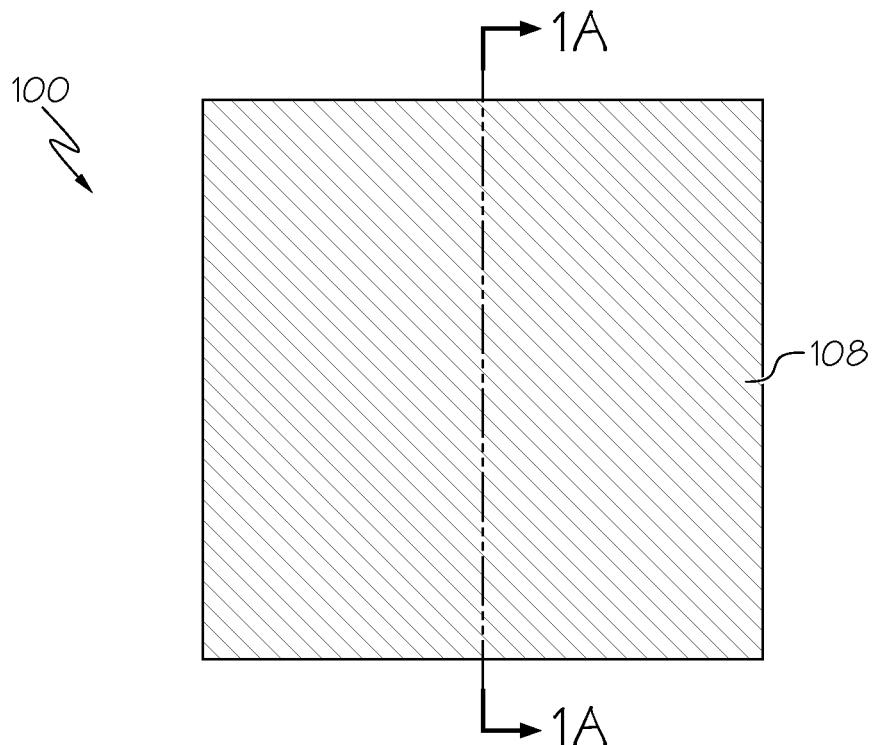
FIG. 1 is a top view of a semiconductor structure comprising alternating semiconductor layers according one embodiment of the present disclosure.

It is to be understood that the various layers and/or regions shown in the accompanying drawings are not drawn to scale, and that one or more layers and/or regions of a type commonly used in metal-oxide semiconductor (MOS) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present disclosure may be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

As used herein, "vertical" refers to a direction perpendicular to a substrate in the views herein. As used herein, "horizontal" refers to a direction parallel to a substrate views herein. As used herein, "thickness" refers to a size of an element (e.g., a layer, trench, hole, etc.) in the cross-sectional views measured from a bottom surface to a top surface, or a left side surface to a right side surface of the element, and/or measured with respect to a surface on which the element is directly on.

Unless otherwise specified, as used herein, "height" or "height above a substrate" refers to a vertical size of an element (e.g., a layer, trench, hole, etc.) in the cross-sectional views measured from a top surface of the substrate to a top surface of the element. A thickness of an element can be equal to a height of the element if the element is directly on the substrate. As used herein, "lateral", "lateral side", and "lateral surface" refer to a side surface of an element (e.g., a layer, opening, etc.), such as a left or right side surface in the cross-sectional views herein.

Various embodiments will now be discussed in further detail with regard to semiconductor devices and methods of manufacturing the same and, in particular, to a fabrication method and structure of a nanosheet-based semiconductor device with complete removal of an organic planarization layer (OPL) such that a residue free gap fill layer may be formed. OPL open/ash in work function metal patterning is typically performed using a dry removal process (e.g., reactive ion etch or ash). However, conventional OPL generally can only be wet stripped in a sulfuric acid/hydrogen peroxide mixture (SPM) and usually cannot be used with the work function metal exposed. In addition, OPL dry-etch/ash typically leaves residues on lateral narrow gaps between nanosheets. Wet solvent (other than SPM) strippable OPL can be removed from gaps, but will usually result in OPL undercut on the masked portion of the device.

Embodiments of the present disclosure overcome the above problems with OPL residue and undercutting by utilizing a dual OPL scheme. The dual OPL comprises a low molecular weight high gap fill molecule OPL that is not crosslinked (ex: polyphenolic molecules glass type) and an OPL formed utilizing a deposition process such as, for example, spin-on PGMEA, CVD, PECVD, evaporation, chemical solution deposition, and/or other like deposition techniques. The dual OPL of one or more embodiments enable the complete removal of the OPL within narrow trenches without undercutting on a masked side of the structure. This allows for residue free gap fill to enable nanosheet N/P multi-Vt patterning.

Figure 1A:
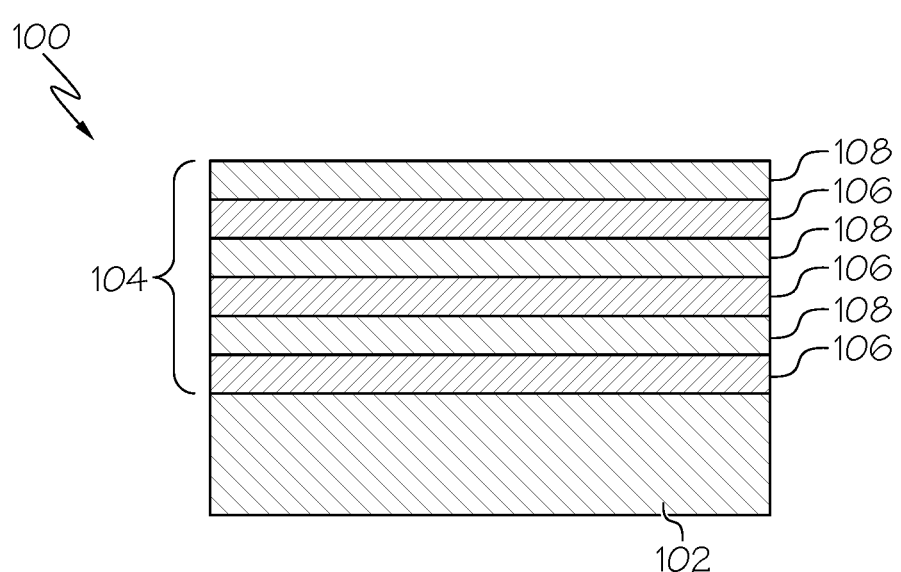
FIG. 1A is a cross-sectional view of the structure shown in FIG. 1 according one embodiment of the present disclosure.

Referring now to the drawings in which like numerals represent the same or similar elements, FIGS. 1 and 1A show a semiconductor structure 100 comprising a handle substrate 102. The handle substrate 102, in one embodiment, includes a semiconductor material, an insulator material, a conductive material, or a combination thereof. The thickness of the handle substrate 102, in one embodiment, may range from 50 microns to 2 mm, although lesser and greater thicknesses can also be employed. In the example shown in FIGS. 1 and 1A, the substrate 102 is a bulk substrate. However, in other embodiments, the substrate 102 may be a silicon-on-insulator (SOI) substrate. In this example, a dielectric layer (e.g., a BOX layer or oxide layer) overlies the substrate.

Non-limiting examples of suitable materials for the substrate 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials may include at least one "III element," such as aluminum (Al), boron (B), gallium (Ga), indium (In), and at least one "V element," such as nitrogen (N), phosphorous (P), arsenic (As), antimony (Sb).

The structure 100 further comprises a stack 104 of alternating first (sacrificial) semiconductor material layers 106 and second (channel) semiconductor material layers 108 formed in contact with the substrate 102. In embodiments, where the substrate 102 is a bulk substrate, the stack 104 may be formed in contact with the substrate 102. Alternatively, in embodiments where the substrate 102 is an SOI substrate the stack 104 may be formed in contact with the insulating layer formed on the substrate 102. As used herein, a "semiconductor material" refers to a material having a conductivity in a range from $3.0 \times 10^{-4}$ Ohm-cm to $3.0 \times 10^{3}$ Ohm-cm, and includes an intrinsic semiconductor material, a p-doped semiconductor material, an n-doped semiconductor material, or a combination of semiconductor materials having different types of doping. The sacrificial layers 106 include a first semiconductor material that can be removed selective to the second semiconductor material of the channel layers 108. Each of the at least one sacrificial layers 106 and the channel layers 108 may be single crystalline. In one embodiment, the entirety of the stack 104 is single crystalline.

In one or more embodiments, the semiconductor material layers 106, 108 may be referred to as nanosheets or nanowires. These terms may be used interchangeable and refer to a sheet or a layer having nanoscale dimensions. A nanosheet may be used to refer to a nanowire with a larger width, and/or nanowire may be used to refer to a nanosheet with a smaller width, and vice versa. In one embodiment, the sacrificial layers 106 include a silicon-containing semiconductor material in which the atomic concentration of silicon is greater than 80%, and the channel layers 108 include a germanium-containing semiconductor material in which the atomic concentration of germanium is greater than 15%. For example, the sacrificial layers 106 may include single crystalline silicon or a single crystalline silicon-germanium alloy in which the atomic concentration of germanium is less than 20%. However, other concentrations of Si and SiGe are applicable as well. In other embodiments, the sacrificial layers 106 includes a silicon germanium material and the channel layers 108 include a silicon material.

In another embodiment, the sacrificial layers 106 include a first single crystalline compound semiconductor material, and the channel layers 108 include a second single crystalline compound semiconductor material that can be removed selective to the first single crystalline compound semiconductor material. For example, the sacrificial layers 106 comprise silicon-germanium (SiGe), and the channel layers 108 comprise silicon. In one embodiment, each of the sacrificial layers 106 is deposited as a single crystalline semiconductor material layer in epitaxial alignment with an underlying material layer. In one embodiment, each of the channel layers 108 is deposited as a single crystalline material layer in epitaxial alignment with an underlying material layer.

The thicknesses of the sacrificial layers 106 and the channel layers 108 may be selected such that the entirety of the epitaxial alignment of the sacrificial layers 106 and the channel layers 108 can be maintained throughout the entirety of the stack. Thus, the thickness of each of the sacrificial layers 106 and the channel layers 108 may be less than the corresponding critical thickness, which is the thickness at which an epitaxial material begins to lose epitaxial registry with the underlying single crystalline layer by developing dislocations. For example, the thickness of each of the sacrificial layers 106 and the channel layers 108 may be in a range from 3 nm to 60 nm, although lesser and greater thicknesses can also be employed.

In some embodiments, the stack 104 is formed by a series of epitaxial growth processes. The terms "epitaxial growth", "epitaxial deposition", "epitaxially formed", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

In one embodiment, the number of repetitions for a pair of a sacrificial layer 106 and a channel layer 108 may be 2 or greater. In one embodiment, the number of repetitions for a pair of a sacrificial layer 106 and a channel layer 108 is in a range from, and including, 2 to, and including, 100. The stack 104, in one embodiment, begins, at the bottom, with a sacrificial layer 106 or with a channel layer 108. In one embodiment, the stack terminates, at the top, with a sacrificial layer 106 or with a channel layer 108.

Figure 2:
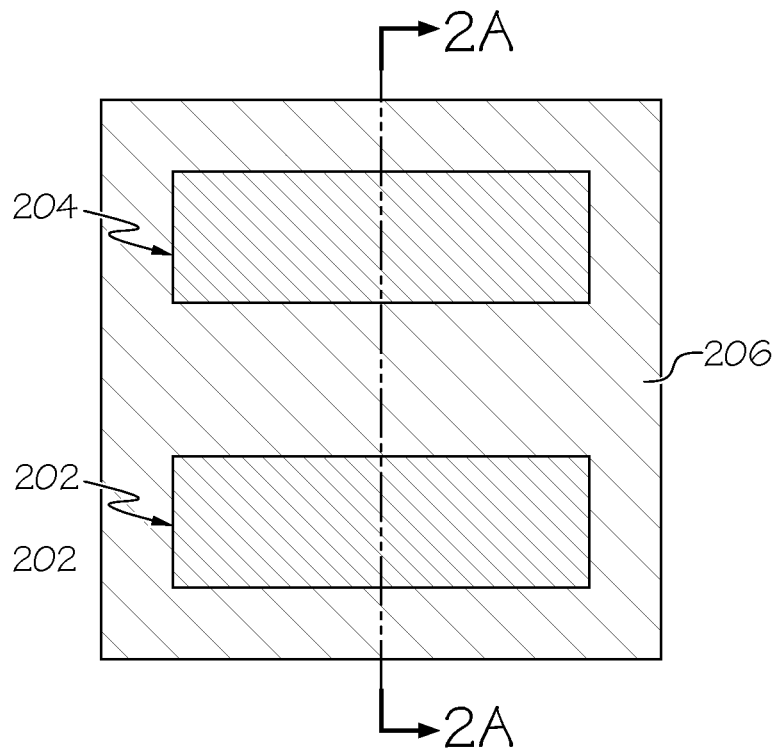
FIG. 2 is a top view of the semiconductor structure nanosheet stacks have been patterned according one embodiment of the present disclosure.
Figure 2A:
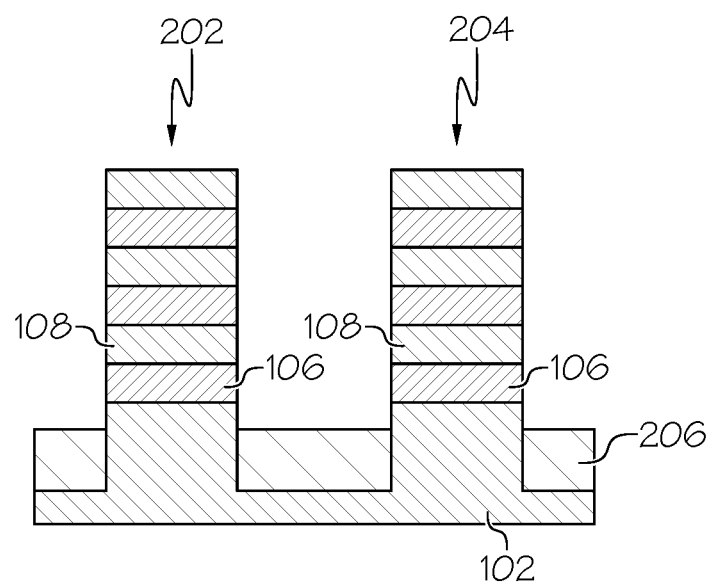
FIG. 2A is a view of the structure shown in FIG. 2 taken transverse to the long axis of the nanosheet stacks according one embodiment of the present disclosure.

An optional cap material layer (not shown) may be formed on top of the stack 104. The cap material layer, in one embodiment, includes a dielectric material such as silicon nitride, silicon oxide, or a dielectric metal oxide, and can be formed by chemical vapor deposition (CVD). The thickness of the cap material layer, in one embodiment, ranges from 3 nm to 60 nm, although lesser and greater thicknesses can also be employed. The stack 104 of the sacrificial layers 106 and the channel layers 108 are patterned to form the one or more vertical stacks (nanosheet stacks) 202, 204 of alternating sacrificial and channel layers 106, 108, as shown in FIGS. 2 and 2A. In some embodiments, one or more of the vertical stacks 202 may be pFET device stacks and one or more of the remaining vertical stacks 204 may be nFET device stacks.

In one embodiment, the vertical stacks 202, 204 may be formed by applying a photoresist layer (not shown) over the top channel layer 108 of the stack 104 (or the optional cap layer if formed) and lithographically patterning the photoresist layer to cover one or more contiguous areas. The shape of the contiguous area(s) covered by the patterned photoresist layer may be selected to include an elongated region having a same width and two end portions having a greater width than the elongated region. The pattern in the photoresist layer(s) can be transferred through the alternating stack by an anisotropic etch. A remaining portion(s) of the stack of the sacrificial layers 106 and the channel layers 108 constitute the vertical stacks 202, 204. Besides the lithography patterning, other patterning techniques such as sidewall imaging transfer, multiple patterning, or the combination of those techniques can be used to pattern the stack. In an embodiment where the substrate 102 is a bulk substrate, isolation regions 206 are formed between each of the vertical stacks 202, 204. It should be noted that embodiments of the present disclosure are not limited to the process discussed above for forming the vertical stacks 202, 204.

In one embodiment, each of the sacrificial layers 106 and the channel layers 108 has a uniform width in a range from 10 nm to 100 nm. The sacrificial layers 106 and the channel layers 108, in one embodiment, have sidewalls that are vertically coincident among one another. As used herein, surfaces are "vertically coincident" if the surfaces are located within a same vertical plane. In one embodiment, sacrificial layers 106 and the channel layers 108 have a same horizontal cross-sectional shape. In one embodiment, the vertical stacks 202, 204 are semiconductor material fins and second semiconductor material fins, respectively. As used herein, a "fin" refers to a structure having a pair of vertical sidewalls and a uniform width between the pair of vertical sidewalls that is invariant under translation along the direction of the vertical sidewalls. The vertical stacks 202, 204 constitute semiconductor fins having a pair of parallel sidewalls that extend along a lengthwise direction and having a uniform width throughout. As used herein, a "lengthwise direction" is a horizontal direction around which an axis passing through a center of mass of an element would have the least moment of inertia.

In one embodiment, the sacrificial layers 106 and the channel layers 108 are single crystalline and epitaxially aligned among one another. Further, the sacrificial layers 106 and the channel layers 108, in on embodiment, have different lattice constants. In this case, the sacrificial layers 106 and the channel layers 108 can be in opposite types of stress along horizontal directions. If the optional cap layer is employed, it can be removed once the alternating stack 104 of the sacrificial layers 106 and the channel layers 108 is formed, for example, by a wet etch that removes the material of the cap layer selective to the substrate 102 and the alternating stack 104 of the sacrificial layers 106 and the channel layers 108.

Figure 3:
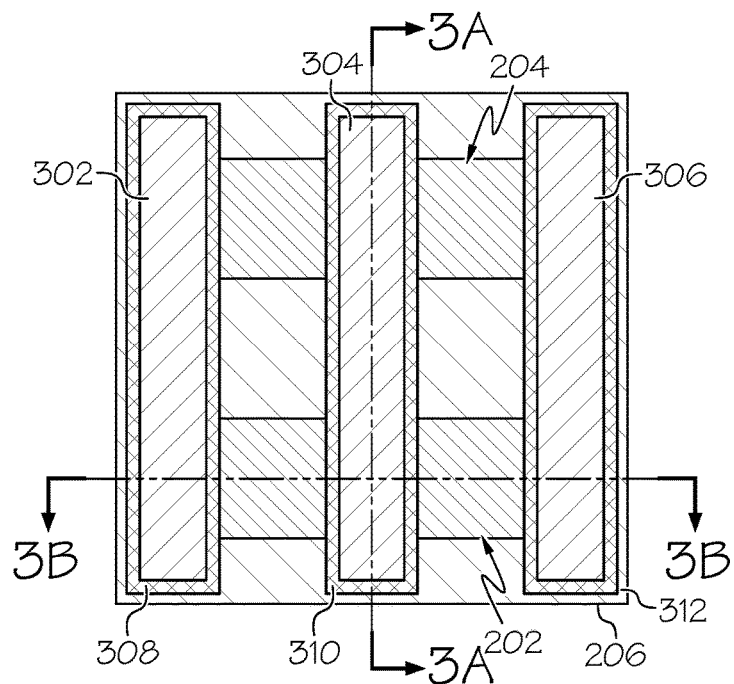
FIG. 3 is a top view of the semiconductor structure after disposable gate structures have been formed according one embodiment of the present disclosure.
Figures 3A, 3B:
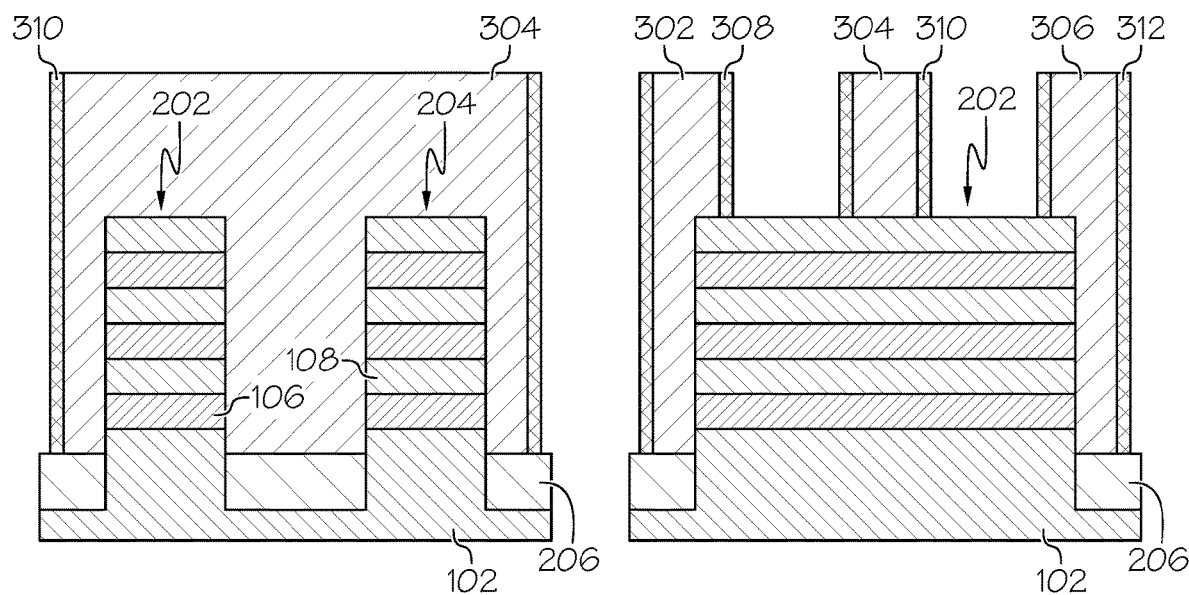
FIG. 3A is a view of the structure shown in FIG. 3 taken transverse to the long axis of the nanosheet stacks according one embodiment of the present disclosure.
FIG. 3B is a cross-section view of the structure shown in FIG. 3 taken along a line that passes through a nanosheet stack according one embodiment of the present disclosure.

FIGS. 3-3B show that one or more disposable/dummy gate structures 302, 304, 306 are formed over and across (wrapping) portions of the vertical stacks 202, 204 that will serve as a channel region(s) of the device(s). In other embodiments, a single disposable gate structure may be formed as compared to separate disposable gate structures. In one embodiment, each of the disposable gate structures 302, 304, 306 includes a disposable gate portion and a disposable gate cap. In some embodiments, an etch stop layer (not shown) may be formed on the vertical stacks 202, 204 prior to forming the disposable gate structures 302, 304. The disposable gate structures may then be formed on and in contact with the etch stop layer.

In one embodiment, the disposable gate portions include a dielectric material. For example, the disposable gate portions include amorphous carbon, amorphous silicon, diamond-like carbon (DLC), a dielectric metal oxide, silicon nitride, or an organosilicate glass. Alternatively, the disposable gate portions 306, 308 include a stack of a disposable material liner (not shown) and a disposable gate material portion (not shown). In this case, the disposable material liner can include a dielectric material such as silicon oxide. The disposable gate material portion, in one embodiment, includes a dielectric material, a semiconductor material, or a conductive material, provided that the disposable gate material portion can be removed selective to the dielectric materials of a planarization dielectric layer and a gate spacer to be subsequently formed. The disposable gate caps include a material such as silicon nitride and may be a bi-layer cap (e.g., nitride-oxide). The disposable gate structures in one embodiment, may be formed by deposition and patterning of at least one material layer. The patterning of the at least one material layer may be performed by a combination of lithographic methods and an anisotropic etch.

FIG. 3 further shows that a gate spacer 308, 310, 312 is formed around (wraps) each of the disposable gate structures 302, 304, 306. In one embodiment, the gate spacers 308, 310, 312 are formed by depositing a conformal dielectric material layer on the disposable gate structures 302, 304, 306 and the vertical stacks 202, 204 and anisotropically etching the conformal dielectric material layer. The conformal dielectric material layer includes a dielectric material that is different from the material of the disposable gate portions. For example, the conformal dielectric material layer may include silicon nitride, silicon oxide, and/or dielectric metal oxide. An anisotropic etch process is employed to anisotropically etch horizontal portions of the conformal dielectric material layer. Further, vertical portions of the conformal dielectric material layer may be recessed below a top surface of the disposable gate caps.

Figure 4:
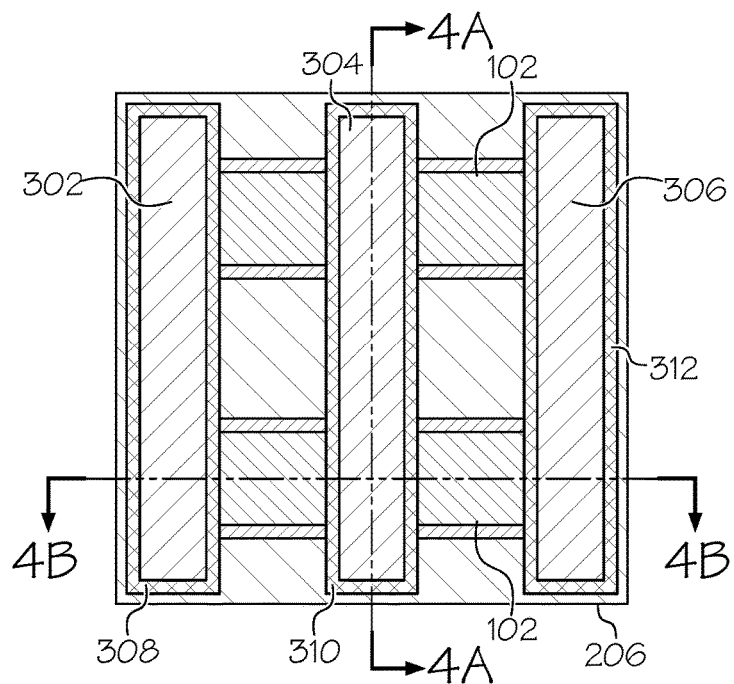
FIG. 4 is a top view of the semiconductor structure after portions of the nanosheets stacks have been recessed for formation of source/drains according one embodiment of the present disclosure.
Figures 4A, 4B:
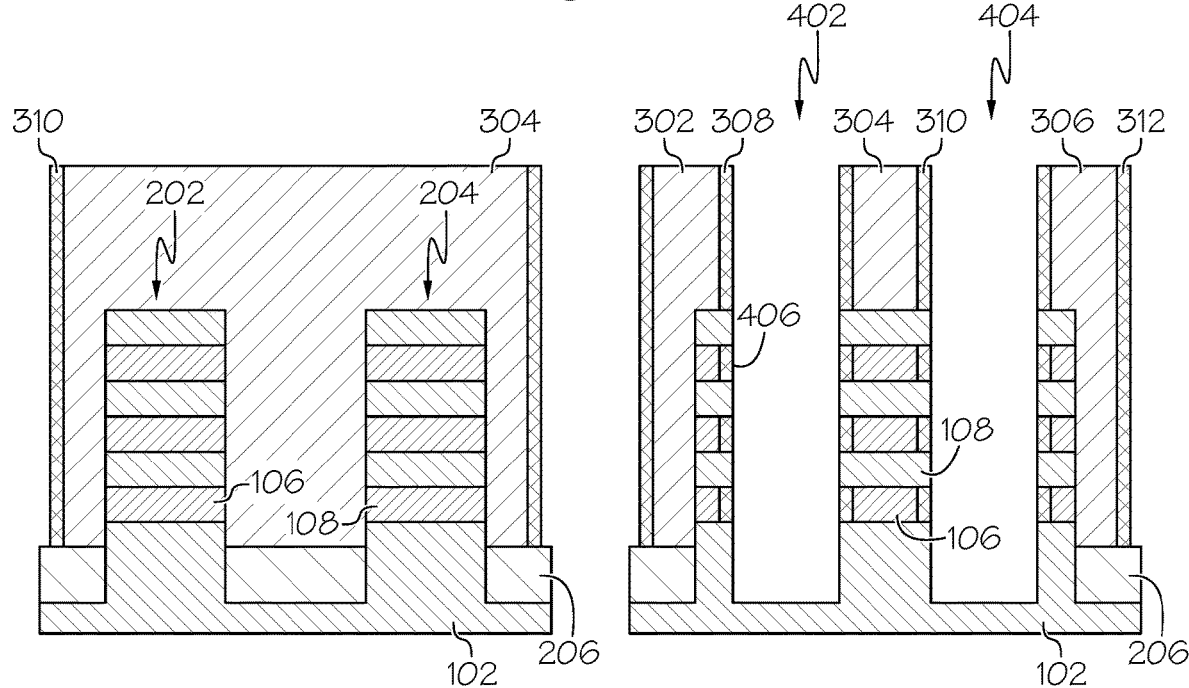
FIG. 4A is a view of the structure shown in FIG. 4 taken transverse to the long axis of the nanosheet stacks according one embodiment of the present disclosure.
FIG. 4B is a cross-section view of the structure shown in FIG. 4 taken along a line that passes through a nanosheet stack according one embodiment of the present disclosure.

FIGS. 4 to 4B show that exposed portions of the vertical stacks 202, 204, which do not underlie a disposable gate stack 302, 304, 306 and spacer 308, 310, 312, are removed or recessed. For example, a directional etching process such as a reactive-ion-etching (RIE) process may be utilized to remove the exposed portions of the vertical stacks 202, 204. This etching process results in a trench 402, 404 being formed between the spacers 308, 310, 312 of neighboring disposable gate stacks 302, 304, 306. Each of the trenches may expose a portion of the top surface of the substrate 102; ends of the sacrificial layers 106; and ends of the channel layers 108.

FIG. 4B further shows that inner spacers 406 are formed in contact with sidewalls of the sacrificial layers 106. In one embodiment, the inner spacers 406 are formed by removing a portion of the sacrificial layers 106 to reduce the size of the sacrificial layers 106 in at least one lateral dimension (i.e., length, width). The portion of the sacrificial layers 106 may be removed using an isotropic etch (e.g., wet chemical etch, non-directional dry plasma etch, etc.), where the isotropic etch etches laterally into the sacrificial layers 106. The isotropic etch may remove a predetermined amount of material from the sacrificial layers 106, where the etch may be a timed etch to uniformly remove an equal amount of material from each exposed end. The isotropic etch may form indentations having a predetermined indentation depth into the sacrificial layers. After the etching process, the channel layers 108 may extend passed the sacrificial layers 106 by a predetermined distance. Each of the indentations may extend into the area below the disposable gate spacer 308, 310, 312.

A deposition process such as ALD, PEALD, CVD, PECVD, or combinations thereof, is performed to conformally deposit the inner spacer material within the indentations and form the inner spacers 406. Portions of the inner spacers 406 that extend out beyond the disposable gate spacers 308, 310, 312 may be removed by a directional etch (e.g., RIE). In one or more embodiments, the inner spacers 406 may comprise silicon nitride (SiN), a silicon oxide (SiO), silicon oxynitride (SiON), silicon oxycarbide (SiOC), a silicon boro carbonitride (SiBCN), a silicon oxy carbonitride (SiOCN), a silicon carbide (SiC), a high-k metal oxide, a low-k insulator, or suitable combinations thereof.

Figure 5:
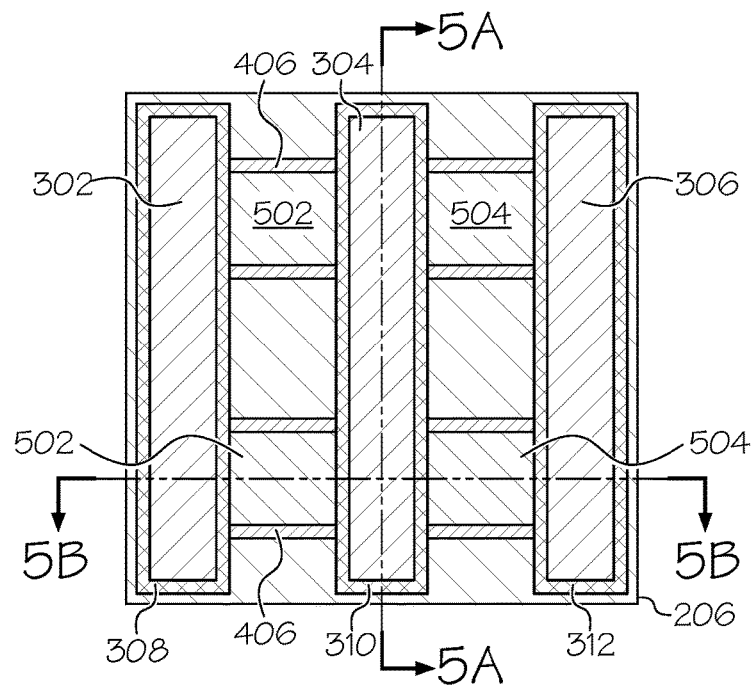
FIG. 5 is a top view of the semiconductor structure after source/drains have been formed according one embodiment of the present disclosure.
Figures 5A, 5B:
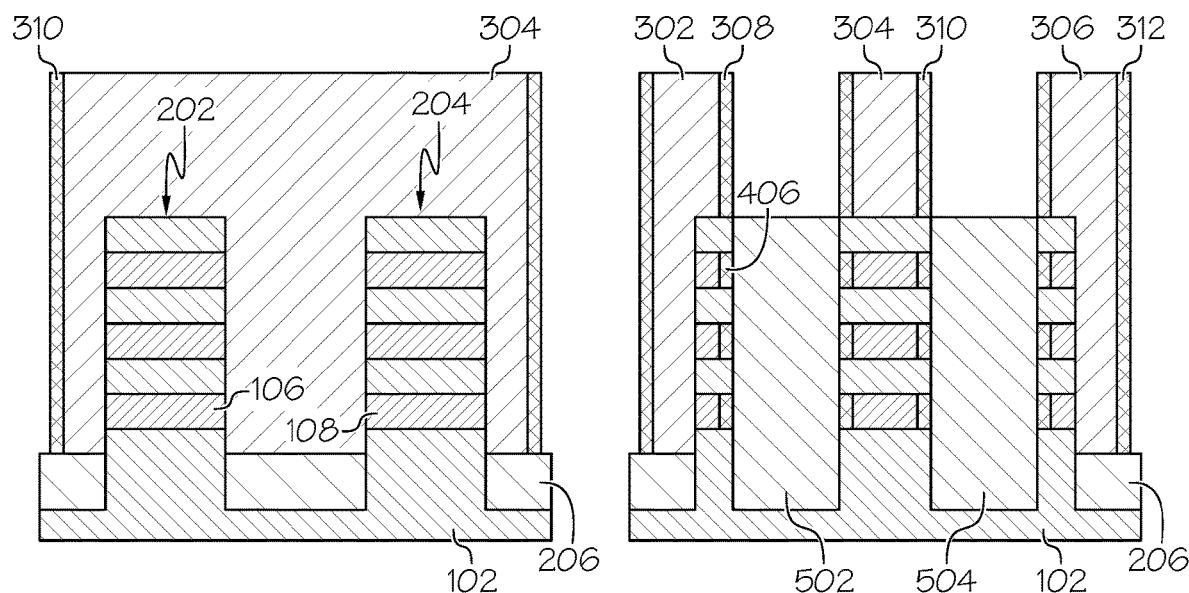
FIG. 5A is a view of the structure shown in FIG. 5 taken transverse to the long axis of the nanosheet stacks according one embodiment of the present disclosure.
FIG. 5B is a cross-section view of the structure shown in FIG. 5 taken along a line that passes through a nanosheet stack according one embodiment of the present disclosure.

A selective epitaxy process is then performed to form source and drain regions 502, 504 as shown in FIGS. 5 to 5B. In one embodiment, the ends of the sacrificial layers 106 and/or the ends of the channel layers 108 of the vertical stacks 202, 204 are used as seeds for the epitaxy process. During the selective epitaxy process, a semiconductor material is deposited only on semiconductor surfaces, and does not nucleate on dielectric surfaces. The source region 502 grows from surfaces of the sacrificial layers 106 and/or the channel layers 108 located on one side of the disposable gate structures 302, 304, 306. The drain region 504 grows from surfaces of the sacrificial layers 106 and/or the channel layers 108 located on the other side of the disposable gate structures 302, 304, 306.

Each of the source and drain regions 502, 504, in one embodiment is single crystalline, and is epitaxially aligned to the single crystalline structure of the vertical stack of the sacrificial layers 106 and the channel layers 108. The source and drain regions 502, 504, in one embodiment, may be formed with in-situ doping of the electrical dopants, or by deposition of an intrinsic semiconductor material and subsequent introduction of electrical dopants by ion implantation, plasma doping, gas phase doping, or out-diffusion from a disposable doped silicate glass layer. In one embodiment, activation of the dopants forms a sharp junction. It should be noted that one or more embodiments are not limited to the process discussed above for forming the source and drain regions 402, 504.

Figure 6:
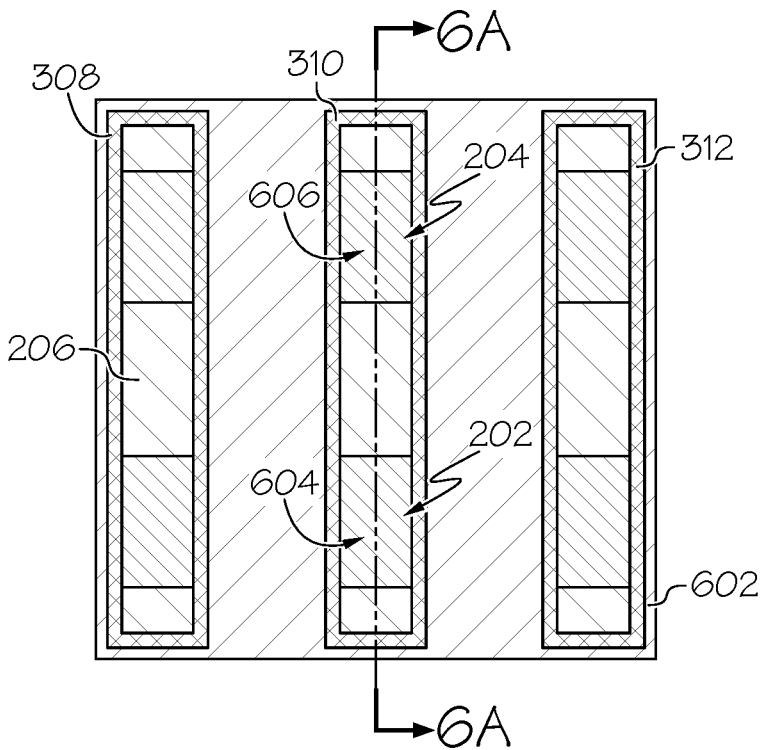
FIG. 6 is a top view of the semiconductor structure after the disposable gate structures have been removed according one embodiment of the present disclosure.
Figure 6A:
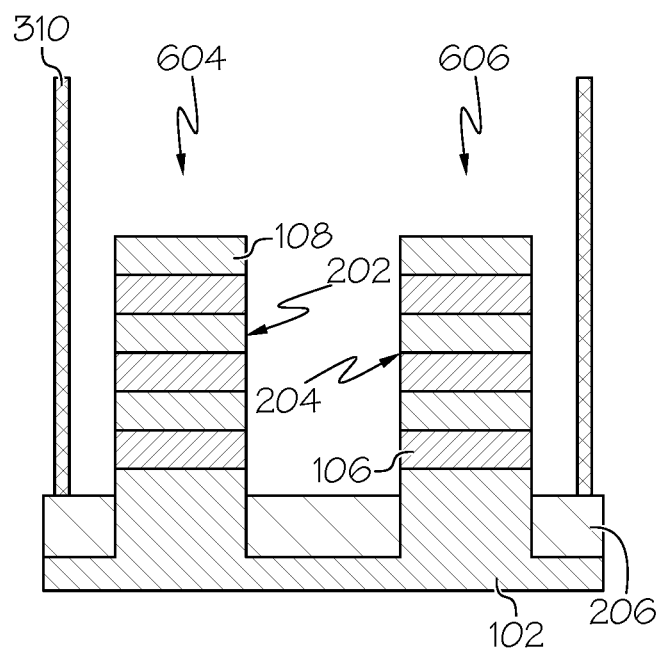
FIG. 6A is a view of the structure shown in FIG. 6 taken transverse to the long axis of the nanosheet stacks according one embodiment of the present disclosure.

FIGS. 6 and 6A show that an inter-layer dielectric (ILD) layer 602 is deposited over the vertical stacks 202, 204, disposable gate structures 302, 304, 306, and source/drains 502, 504, as shown in FIGS. 6 and 6A. A planarization process is performed to planarize the ILD 602 down to be coplanar with a top of the disposable gate structures 302, 304, 306. The planarization process may include a chemical mechanical polishing (CMP) process. The ILD layer 602 may comprise silicon oxide, oxynitride, or other suitable materials.

FIGS. 6 and 6A further show that the disposable gate structures 302, 304, 306 are selectively removed via selective etching. The selective etching process may include, for example, an isotropic etch and/or an anisotropic etch. A gate cavity 604, 606 is formed in the volume from which the disposable gate structures 302, 304, 306 were removed. A portion of the top surface of the top/upper most second semiconductor layer 108 is exposed within each gate cavity 604, 606. Sidewall surfaces of a portion of the spacers 308, 310, 312 and the first/channel layers 106, 108 are also exposed within each gate cavity 604, 606.

Figure 7:
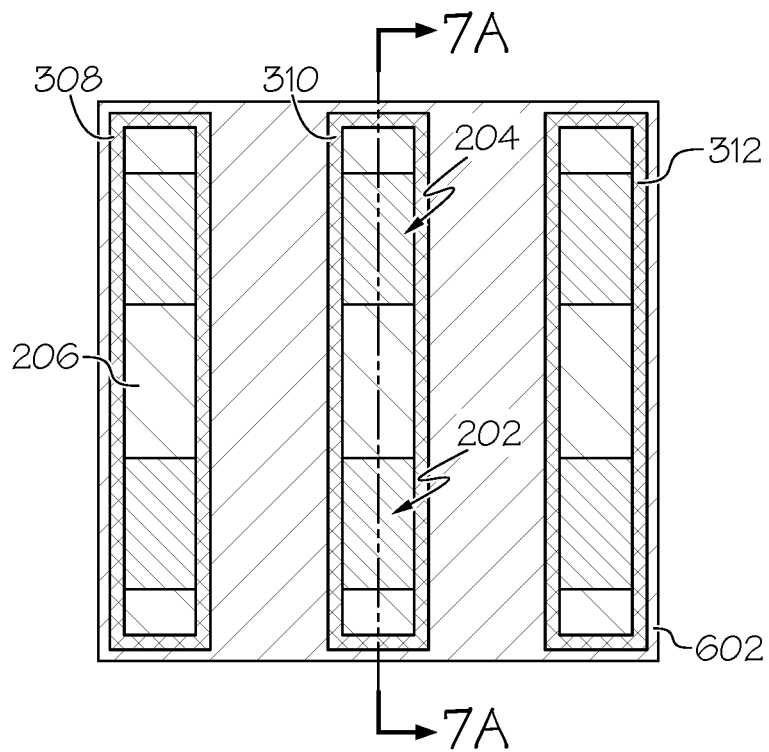
FIG. 7 is a top view of the semiconductor structure after sacrificial layers of the nanosheet stacks have been removed according one embodiment of the present disclosure.
Figure 7A:
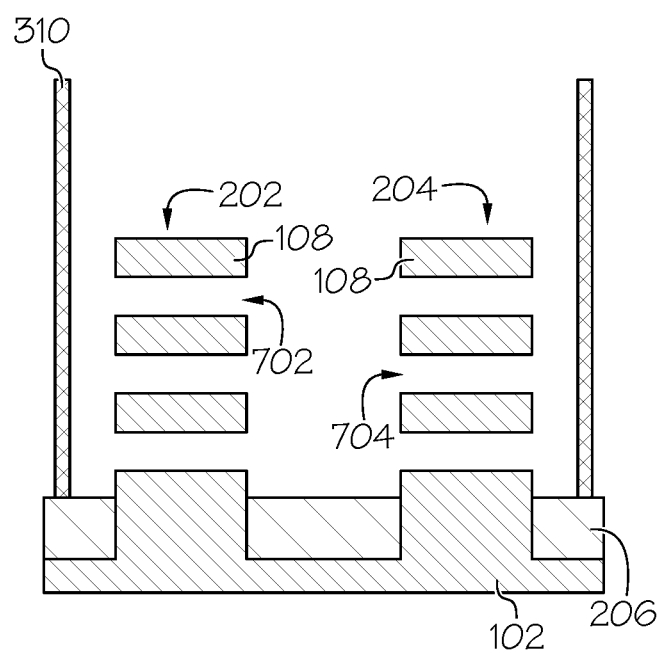
FIG. 7A is a view of the structure shown in FIG. 7 taken transverse to the long axis of the nanosheet stacks according one embodiment of the present disclosure.

FIGS. 7 and 7A show that a selective etching process is performed to remove the sacrificial layers 106 selective to the channel layers 108 of each vertical stack 202, 204. For example, a wet etch process or a reactive ion etch process can be utilized to selectively remove the sacrificial layers 106 of the vertical stacks 202, 204. This process forms cavities 702, 704 between each of the channel layers 108 of the vertical stacks 202, 204, which are anchored by the epitaxy material of the source/drain regions 502, 504.

Figure 8:
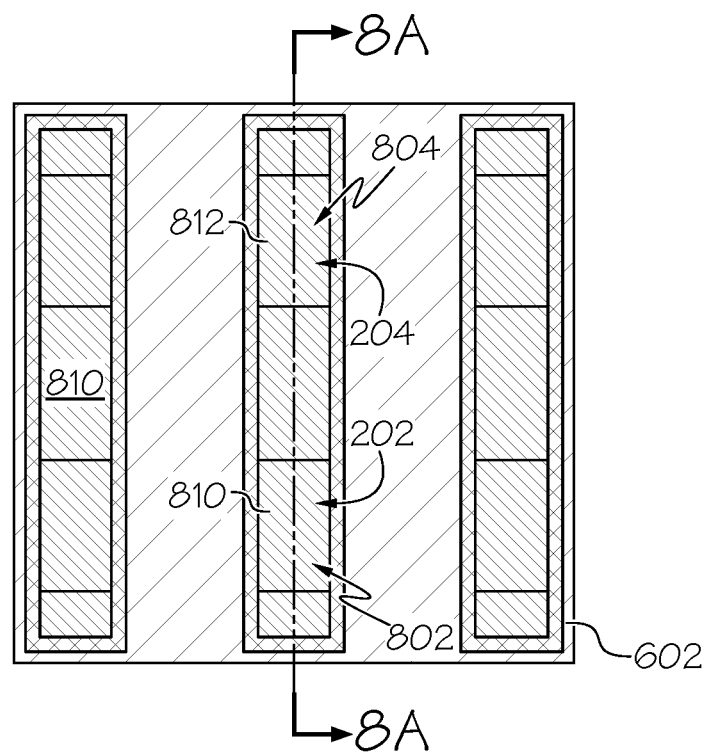
FIG. 8 is a top view of the semiconductor structure after replacement gate structures have been formed on channel layers within channel regions of the structure according one embodiment of the present disclosure.
Figure 8A:
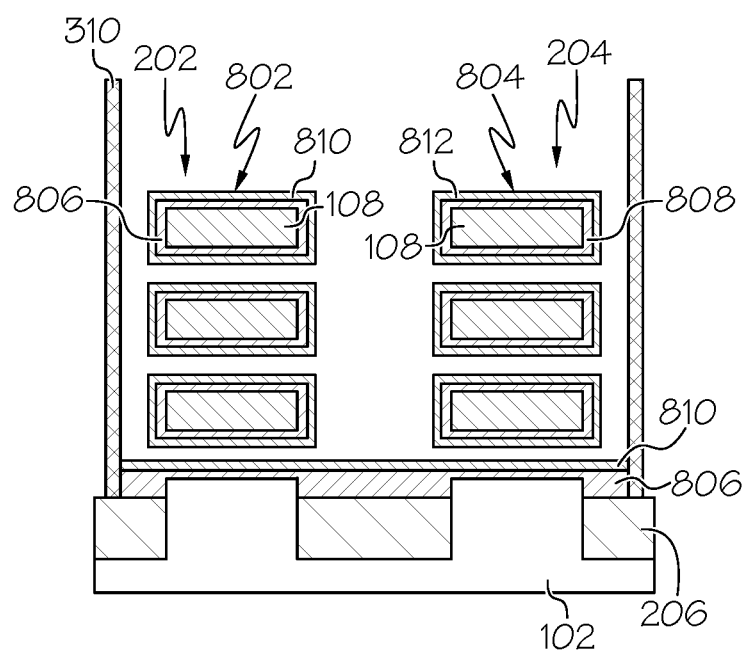
FIG. 8A is a view of the structure shown in FIG. 8 taken transverse to the long axis of the nanosheet stacks according one embodiment of the present disclosure.

FIGS. 8 and 8A show that a replacement gate structure 802, 804 is formed within each of the gate cavities that surrounds the portions of the channel layers 108 within the gate cavities in a gate-all-around (GAA) configuration. In one embodiment, the replacement gate structure 802, 804 is a metal gate and the present embodiment is a replacement metal gate process. The replacement gate structure 802, 804 may comprise a gate dielectric 806, 808 and a conductive gate electrode 810, 812. The gate dielectric 806, 808 may be formed on the channel layers 108 prior to placing the conductive gate electrode 810, 812, so as to separate the nanowire channels from the conductive gate electrode 810, 812. By way of example, in the case of a metal gate, a suitable gate dielectric may be an insulating dielectric layer, for example, a silicon oxide (SiO), silicon nitride (SiN), silicon oxynitride (SiON), a high-K dielectric, or a suitable combination of these materials. The term "high-κ" as used herein refers to a material having a relative dielectric constant κ which is much higher than that of silicon dioxide (e.g., a dielectric constant κ=25 for hafnium oxide rather than 4 for silicon dioxide. High-K dielectric materials may include, but are not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In one embodiment, the conductive gate electrode 810, 812 may be formed by depositing a gate material or combination of materials into the gate cavity/trench on the gate dielectric 806, 808. By way of example only, in the case of a metal gate, a combination of gate metals may be used that constitute the conductive gate electrode 810, 812. For instance, a work function setting metal layer may be deposited onto the gate dielectric, followed by a filler metal layer.

The conductive gate electrode 810, 812 and the gate dielectric layer 806, 808 may surround at least a portion of the channel layers 108. The work function layer may be formed on the exposed portion(s) of the gate dielectric layer 806, 808 between the channel layers 108. The work function layer may be formed on the gate dielectric layer 806, 808 to adjust the electrical properties of the conductive gate electrode 810, 812. In various embodiments, the work function layer may be optional. In one or more embodiments, the work function layer may fill in the spaces between the gate dielectric layers 806, 808 on the channel layers 108. The work function layer may be formed by a conformal deposition, for example, ALD.

In various embodiments, a work function layer may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer may include multiple layers of work function materials, for example, a work function layer can be a TiN/TiC stack. In various embodiments, the work function layer may have a thickness in the range of about 3 nm to about 11 nm, or can have a thickness in the range of about 5 nm to about 8 nm.

The metal fill layer may be formed on the gate dielectric layer 806, 808 and/or work function layer if present. The metal fill layer, gate dielectric layer 806, 808, and optionally the work function layer may form a replacement gate structure on one or more the channel layers 108, where the metal fill layer and work function layer form the conductive gate electrode 810, 812. In various embodiments, the metal fill layer may be blanket deposited on the exposed surfaces of the gate dielectric layer 806, 808 and/or work function layer. In one or more embodiments, the metal fill layer may be a conductive metal, where the metal may be aluminum (Al), gold (Au), silver (Ag), copper (Cu), tungsten (W), titanium (Ti), molybdenum (Mo), cobalt (Co), or a conductive carbon material (e.g., carbon nanotube, graphene, etc.), or any suitable combinations thereof. It should be noted that one or more embodiments are not limited to the process discussed above for forming the replacement gate structures 802, 804.

Figure 9:
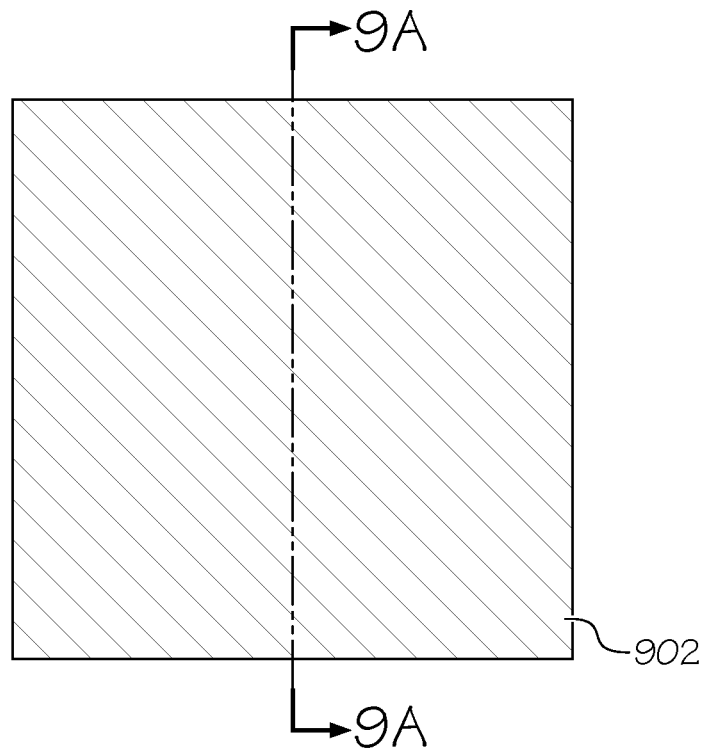
FIG. 9 is a top view of the semiconductor structure after a first planarization layer has been formed over the structure according one embodiment of the present disclosure.
Figure 9A:
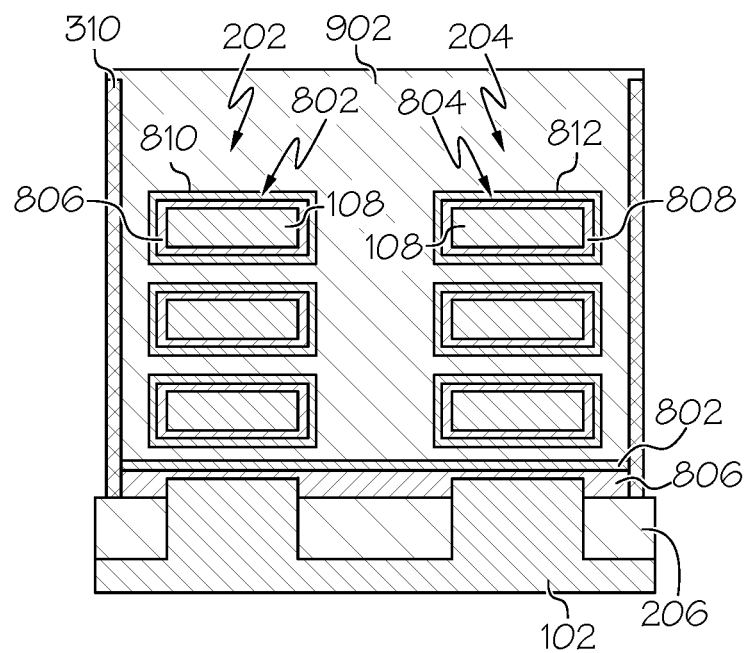
FIG. 9A is a view of the structure shown in FIG. 9 taken transverse to the long axis of the nanosheet stacks according one embodiment of the present disclosure.

After the replacement gate structures 802, 804 have been formed, a gap fill layer 902 such as a first organic planarization layer (OPL) is formed over the structure, as shown in FIGS. 9 and 9A. The first OPL 902 surrounds channel layers 108 in the channel regions and contacts each of the replacement gate structures 802, 804. The first OPL 902 fills the gaps between each channel layer 108. In one embodiment, the first OPL 902 is a narrow gap fill layer having a low molecular weight 0.6-1 kg mol$^{-1}$, high gap fill molecule that can fill gaps in the 2-10 nm range and is not crosslinked such as (but not limited to) a polyphenolic molecules glass type:

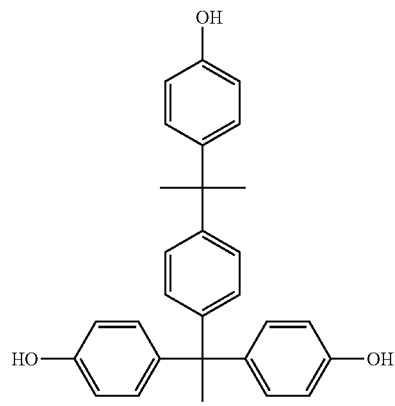 [SMILES: CC(C)(c1ccc(O)cc1)c1ccc(C(C)(c2ccc(O)cc2)c2ccc(O)cc2)cc1]

Figure 10:
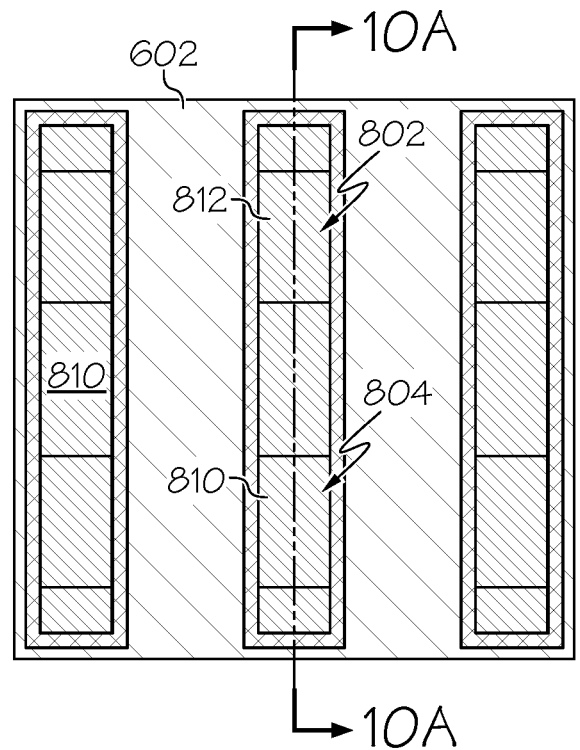
FIG. 10 is a top view of the semiconductor structure after the first planarization layer has been removed except for portions of the first planarization layer between the replacement gate structures formed on the channel layers according one embodiment of the present disclosure.
Figure 10A:
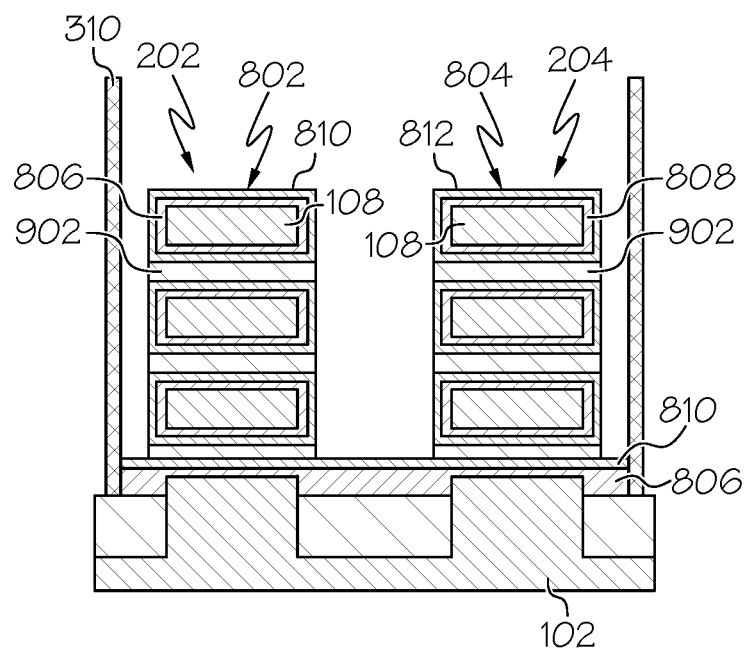
FIG. 10A is a view of the structure shown in FIG. 10 taken transverse to the long axis of the nanosheet stacks according one embodiment of the present disclosure.
Figure 11:
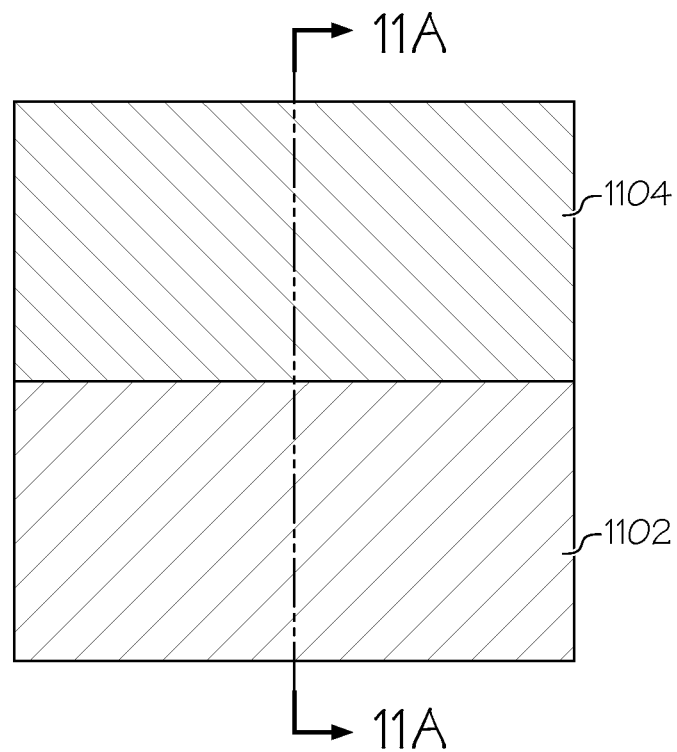
FIG. 11 is a top view of the semiconductor structure after a second planarization layer has formed over the structure according one embodiment of the present disclosure.
Figure 11A:
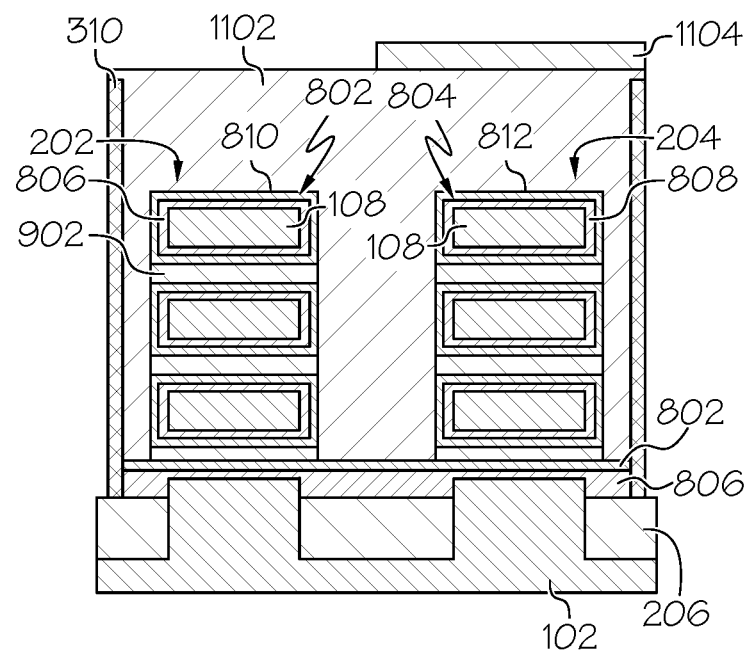
FIG. 11A is a view of the structure shown in FIG. 11 taken transverse to the long axis of the nanosheet stacks according one embodiment of the present disclosure.

The first OPL 902 is also a wet/solvent strippable OPL. For example, the first OPL 902 may have solubility in high polar casting solvents such as (but not limited to) 4-Methyl-2 pentanol type. However, the first OPL 902 is resistant to a less polar casting solvent such as propylene glycol monomethyl ether acetate (PGMEA) used for a second OPL layer 1102 (FIGS. 11 and 11A). OPL 902 is typically deposited by a spin coat process but could also be formed by other processes such as for example, spin-on PGMEA, CVD, PECVD, evaporation, chemical solution deposition and other like deposition techniques An anisotropic blanket etch back process is then performed, as shown in FIGS. 10 and 10A. This process leaves the first OPL 902 between the channels layer 108 in the channel regions; and further removes the first OPL 902 from the remainder of the structure. A masking layer 1102 such as a second OPL is then formed over the structure, as shown in FIGS. 11 and 11A. In one embodiment, the second OPL 1102 may comprise any organic material including, but not limited to, a near-frictionless carbon (NFC) material, and a polyimide. The second OPL 1102 may be formed utilizing a deposition process such as, for example, spin-on PGMEA, CVD, PECVD, evaporation, chemical solution deposition and other like deposition techniques. The second OPL 1102 is resistant to the polar solvents that wet strip the first OPL 902. Chemical mechanical planarization (CMP) and/or grinding can be used to planarize the deposited second OPL 1102. During coating of the second OPL 1102 there will be minimal or low film loss of the first OPL 90202 layer.

Figure 12:
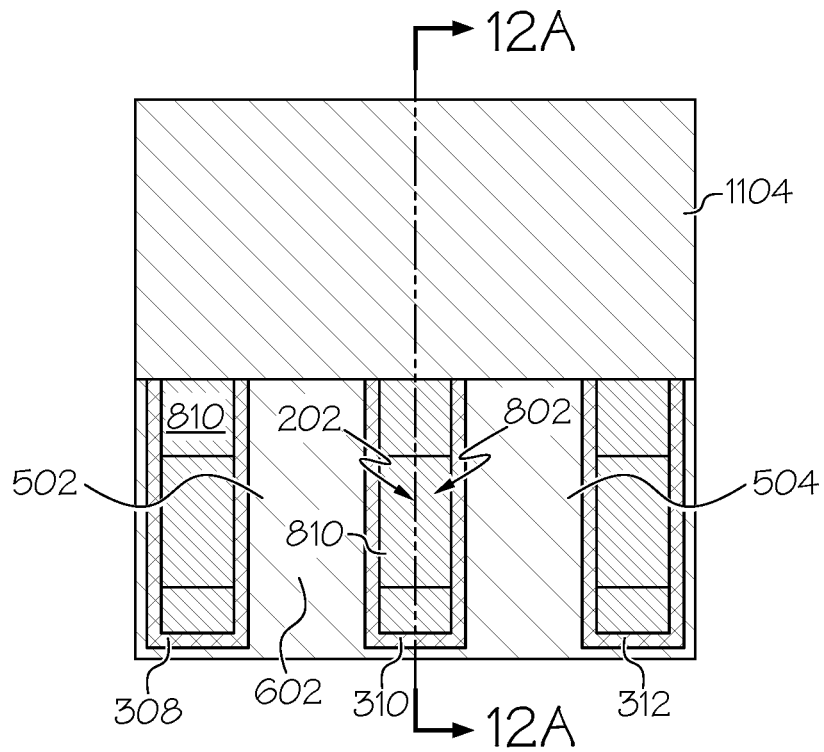
FIG. 12 is a top view of the semiconductor structure after the second planarization layer has been patterned to expose at least one channel region and mask the remaining channel regions of the structure according one embodiment of the present disclosure.
Figure 12A:
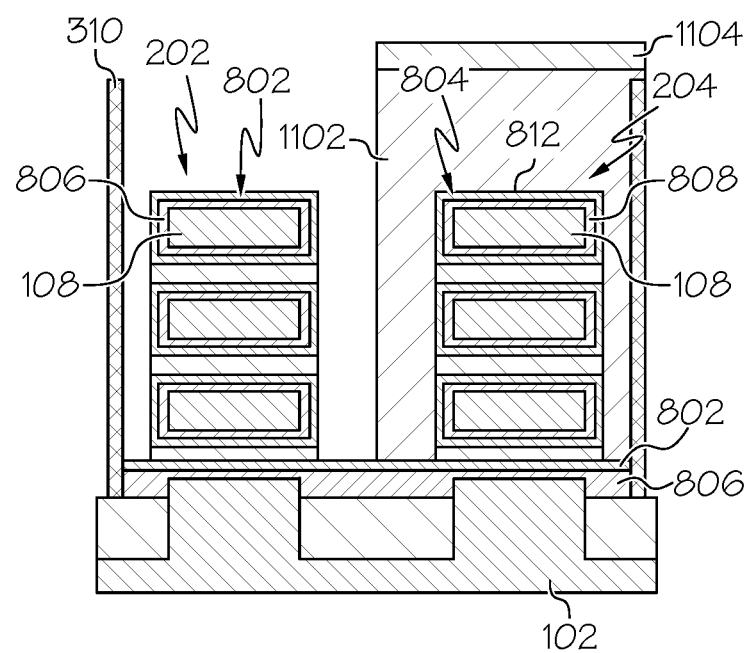
FIG. 12A is a view of the structure shown in FIG. 12 taken transverse to the long axis of the nanosheet stacks according one embodiment of the present disclosure.

FIGS. 11 and 11A further show that a mask or photoresist layer 1104 is formed on top and in contact with the second OPL 1102, and patterned to only remove a portion of the second OPL 1102 above a subset of the vertical stacks 202, 204. The pattern in the photoresist layer(s) may then be transferred through second OPL 1102 by an anisotropic etch resulting in removal of the second OPL 1102 from the subset the vertical stacks 202, 204, as shown in FIGS. 12 and 12A. This exposes a top surface of the replacement gate structure 802 formed on the top most second semiconductor layer portion 108 of the exposed vertical stack(s) 202; sidewalls of the replacement gate structures 802, and sidewalls of the first OPL 902 formed between the exposed the replacement gate structures 802.

Figure 13:
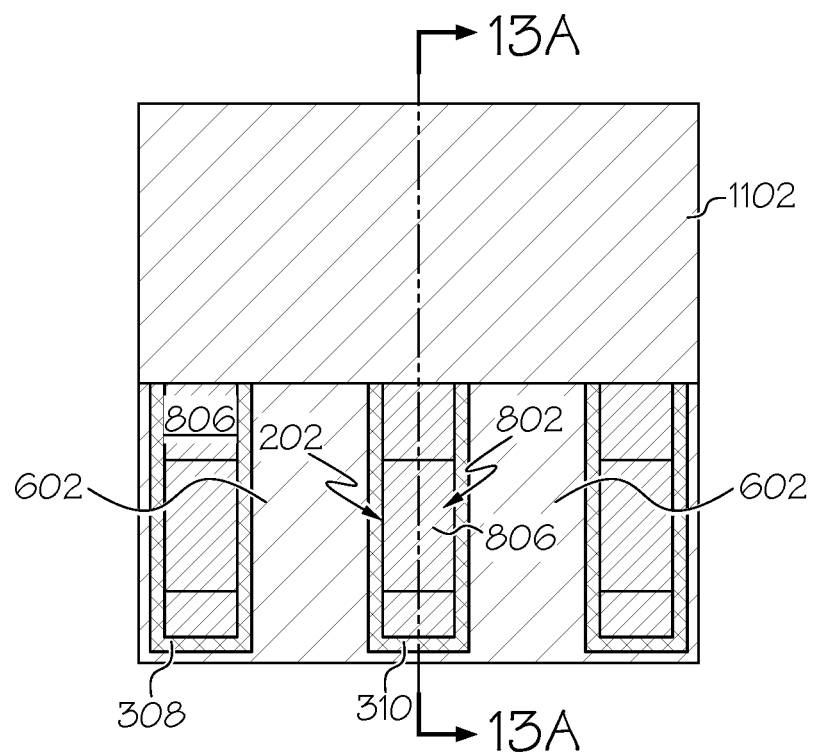
FIG. 13 is a top view of the semiconductor structure after the first planarization layer has been removed from between the replacement gate structures of the exposed channel region(s) and one or more metal layers have been removed from the replacement gate structures according one embodiment of the present disclosure.
Figure 13A:
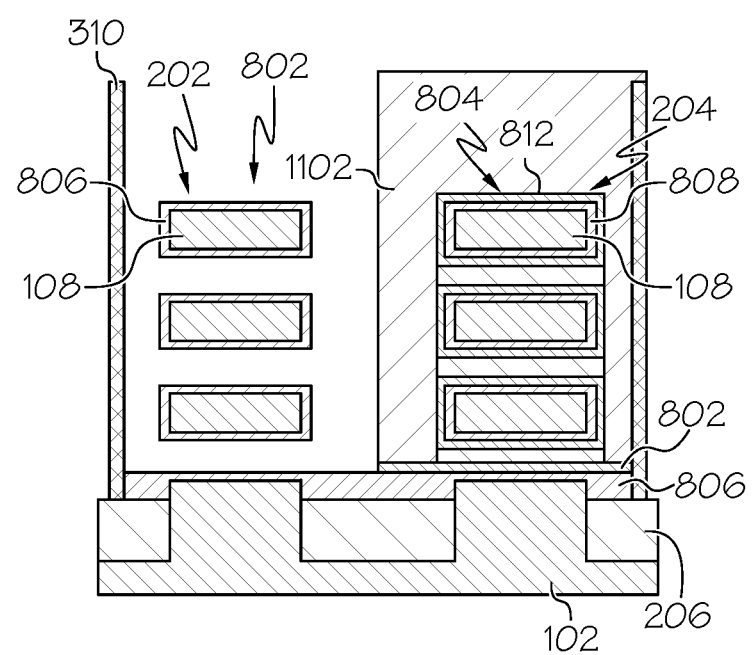
FIG. 13A is a view of the structure shown in FIG. 13 taken transverse to the long axis of the nanosheet stacks according one embodiment of the present disclosure.

FIGS. 13 and 13A show that the first OPL 902 is then removed from between each of the replacement gate structures 802 formed around the channel layers 108. In one embodiment, the first OPL 902 is removed using a wet strip process (e.g., polar solvent). The chemistry of the first OPL 902 and the solvent used during the wet strip process allows for the first OPL 902 to be removed from the narrow gaps between the replacement gate structures 802 without any undercutting on the masked side. The removal of the first OPL 902 exposes the outer surfaces of the replacement gate structures 802 previously in contact with the first OPL 902. The conductive gate electrode 810 may then remove from the exposed replacement gate structures 802 with a wet etch e.g. SC1. The wet etch also removes the mask layer 1104. In some embodiments, the gate electrode 810 may not be removed.

At this point in the fabrication process, additional metal layer(s) may be formed on the exposed replacement gate 802 utilizing a process similar to that discussed above with respect to formation of the replacement gates 802, 804. This allows the replacement gate 802 of the unmasked vertical stack(s) 202 that had the initially deposited metal wet stripped in the previous step, to now have a different thickness than the replacement gates 804 of the previously masked vertical stack(s) 204 and/or have multiple metal layers of different species.

In some embodiments, the additional metal layer(s) may be formed in contact and surrounding with the dielectric layer 806 of the replacement gate 802 or the conductive gate electrode 810 of the replacement gate 802 if it remains. The remaining portion of the second OPL 1102 may then be removed from the masked portion of the structure by, for example, ashing. Conventional fabrication processes may then be performed to complete the device.

Figure 14:
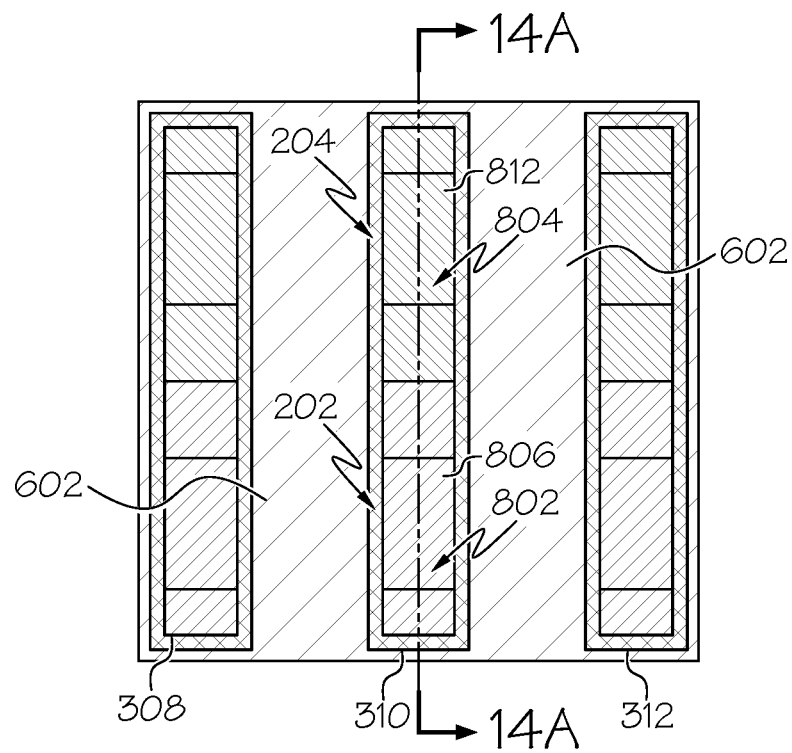
FIG. 14 is a top view of the semiconductor structure after the first and second planarization layers have been removed from the masked channel region(s) according one embodiment of the present disclosure.
Figure 14A:
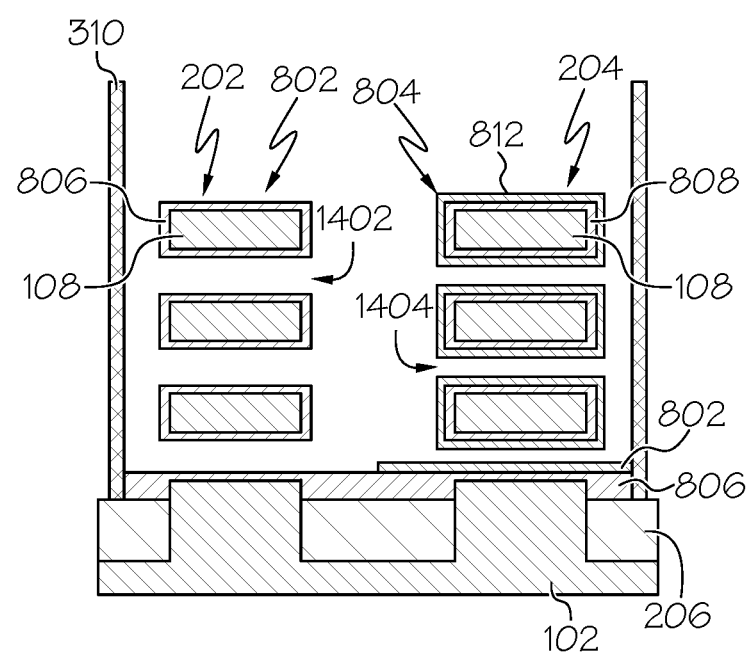
FIG. 14A is a view of the structure shown in FIG. 14 taken transverse to the long axis of the nanosheet stacks according one embodiment of the present disclosure.

In another embodiment, the conductive gate electrodes 810 of the exposed replacement gates 802 are first removed from the unmasked vertical stack(s) 202. Then, the remaining portion of the second OPL 1102 covering the other vertical stack(s) 204 is removed, as shown in FIGS. 14 and 14A. The second OPL 1102 at the masked side of the device may then be removed with a dry etch process leaving both NFET and PFET sides exposed, with replacement gate metal stripped from the unmasked side, but intact on the masked side. Once the second OPL 1102 has been removed from the masked side, the remaining first OPL layer 902 is removed from between each of the replacement gate structures 804 of the masked vertical stack(s) 204 using a wet strip process (e.g., polar solvent). As shown, one or more of the vertical stacks 202 have portions of their channel layers 108 surrounded by separate dielectric layers 806 while the remaining vertical stacks 204 have portions of their channel layers 108 surrounded a separate dielectric layer 808 and gate electrode 812.

A metal layer(s) formation process(es) may then be performed to form a new conductive gate electrodes in contact with and surrounding the exposed dielectric layers 806 of the vertical stack(s) 202, and to also form an additional metal layer(s) on the replacement gate 804 of the other vertical stack(s) 204. In some embodiments, after the various metal layer(s) formation process(es) discussed above have been performed the replacement gates 802, 804 of each vertical stack 202, 204 are separate from each other by unfilled gaps 1402, 1404. Conventional fabrication processes may then be performed to complete the device.

Figure 15:
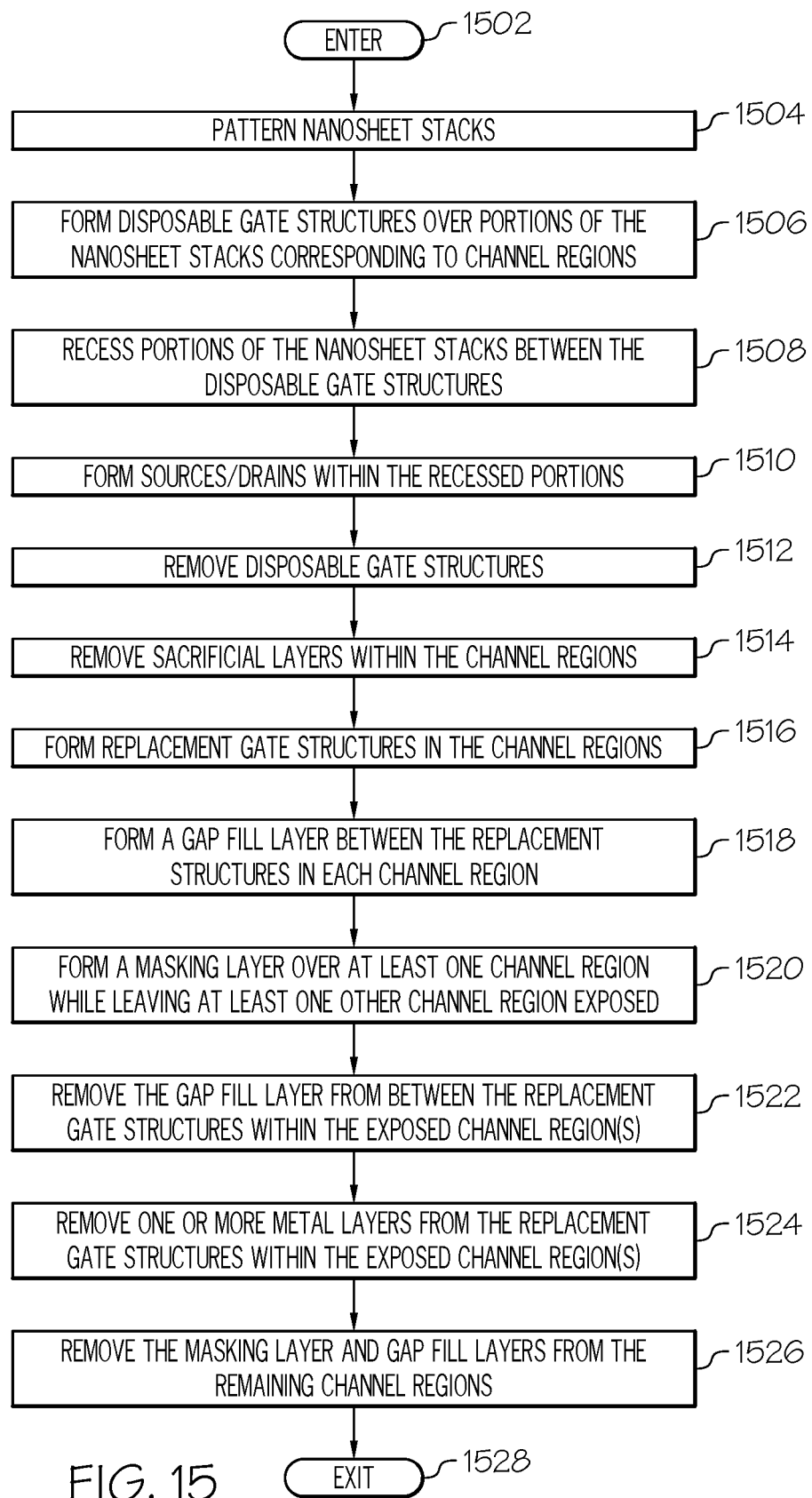
FIG. 15 is an operational flow diagram illustrating one example of a process for forming a semiconductor structure for enabling residue free gap file between nanosheets according one embodiment of the present disclosure.

FIG. 15 is an operational flow diagram illustrating one example of a process for forming a semiconductor structure for enabling residue free gap file between nanosheets according one embodiment of the present disclosure. In FIG. 15, the operational flow diagram begins at step 1502 and flows directly to step 904. It should be noted that each of the steps shown in FIG. 15 has been discussed in greater detail above with respect to FIGS. 1-14A. Nanosheet stacks, at step 1504, are patterned. Disposable gate structures, at step 1506, are formed over portions of the nanosheet stacks corresponding to channel regions. Portions of the nanosheet stacks between the disposable gate structures, at step 1508, are recessed.

Sources and drains, at step 1510, are formed within the recessed portions of the nanosheet stacks. The disposable gate structures, at step 1512, are then removed. Sacrificial layers of the nanosheet stacks within the channel regions, at step 1514, are removed. Replacement gate structures, at step 1516, are formed in contact with and surrounding channel layers of the nanosheet stacks. A gap fill layer, at step 1518, is then formed between the replacement gate structures in each channel region. A masking layer, at step 1520, is formed over at least one channel region while leaving at least one other channel region exposed. The gap fill layer, at step 1522, is removed from between the replacement gate structures within the exposed channel regions(s). One or more metal layers, at step 1524, are removed from the replacement gate structures within the exposed channel region(s). The masking layer and gap fill layers, at step 1526, are removed from the remaining channel regions. The control flow exits at step 1528.

A trench, at step 904, is formed within a substrate. A liner, at step 906, is then formed within the trench. A conductive material, at step 908, is deposited within the trench to form a trench line contacting the liner. A pad layer, at step 910, is formed on and in contact with the trench line(s) (and optionally planarized). A seed layer, at step 912, is formed on and in contact with the pad layer. The seed layer, at step 914, is annealed. The seed layer, at step 916, is then planarized using a process such as CMP. Magnetic tunnel junction stack layers, at step 918, are deposited on and in contact with the seed layer. A hardmask, at step 920, is formed on the magnetic tunnel junction stack layers. The magnetic tunnel junction stack layers, at step 922, are then patterned into a magnetic tunnel junction stack. A spacer material, at step 924, is deposited over and in contact with the seed layer, the magnetic tunnel junction stack, and the hardmask. The spacer material, at step 926, is etched to form a spacer on sidewalls of the magnetic tunnel junction stack and hardmask. The control flow exits at step 928.

Although specific embodiments of the disclosure have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also, these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method for forming a semiconductor structure, the method comprising at least:

depositing a gap fill material over a plurality of channel regions such that the gap fill material surrounds and directly contacts gate structures surrounding nanosheet channel layers in each of the plurality of channel regions and further filling gaps between the gate structures;

etching away portions of the gap fill material situated between each of the plurality of channel regions and in contact with sidewalls of each of the gate structures in the plurality of channel regions, the etching forming a respective gap fill material layer between and in contact with the gate structures in each of the plurality of channel regions; and after the portions of the gap fill material have been etched away, forming a masking layer over at least the gate structures and the gap fill material layer in at least a first channel region of the plurality of channel regions, wherein the gate structures and the gap fill material layer in at least a second channel region of the plurality of channel regions remain exposed.

2. The method of claim 1, wherein forming the masking layer comprises:

depositing a masking material over at least the plurality of channel regions such that the masking material is in contact with the gate structures and the gap fill material layers; and patterning the masking material to expose the gate structures and the gap fill material layer within the at least second channel region.

3. The method of claim 2, wherein the masking material is deposited using a spin-on propylene glycol monomethyl ether acetate (PGMEA) process.

4. The method of claim 1, further comprising:

while the at least first channel region is masked,
removing the gap fill material layer formed between and in contact with the gate structures in the at least second channel region.

5. The method of claim 4, wherein removing the gap fill material layer comprises:

performing a wet strip of the gap fill layer.

6. The method of claim 5, wherein the wet strip is a 4-Methyl-2 pentanol type strip.

7. The method of claim 5, further comprising:

after the gap fill material layer has been removed, forming one or more metal layers on the gate structures within the at least second channel region.

8. The method of claim 5, further comprising:

after the gap fill material layer has been removed, removing one or more metal layers of the gate structures within the at least second channel region.

9. The method of claim 8, further comprising:

after the one or more metal layers have been removed, forming one or more new metal layers in place of the one or more metal layers that have been removed.

10. The method of claim 8, further comprising:

after the one or more metal layers have been removed, removing the masking layer to expose the gate structures and gap fill material layer within the at least first channel region; and removing the gap fill material layer formed within the at least first channel region.

11. The method of claim 10, further comprising:

after the gap fill material layer formed within the at least first channel region has been removed, forming one or more metal layers on the gate structures within the at least first channel region and one or more new metal layers in place of the one or more metal layers that have been removed from the gate structures within the at least second channel region.

12. The method of claim 1, wherein the gap fill material layer is an organic planarization layer comprising a low molecular weight high gap fill molecule that is not cross-linked.

13. The method of claim 1, wherein the gap fill material layer is an organic planarization layer that is soluble in high polar casting solvents.

14. The method of claim 1, wherein forming the masking layer comprises:

depositing a masking material that is resistant to solvents used for subsequently removing the gap fill material layer.

* * * * *